United States Patent
Sridhar et al.

(10) Patent No.: US 7,892,931 B2
(45) Date of Patent: Feb. 22, 2011

(54) USE OF A SINGLE MASK DURING THE FORMATION OF A TRANSISTOR'S DRAIN EXTENSION AND RECESSED STRAINED EPI REGIONS

(75) Inventors: Seetharaman Sridhar, Richardson, TX (US); Majid Mansoori, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 463 days.

(21) Appl. No.: 11/613,798

(22) Filed: Dec. 20, 2006

(65) Prior Publication Data

US 2008/0153221 A1   Jun. 26, 2008

(51) Int. Cl.
*H01L 21/336*   (2006.01)
(52) U.S. Cl. ............... 438/300; 257/E21.431; 257/E21.437; 257/E21.632; 438/199
(58) Field of Classification Search ............... 438/230, 438/229, 199, 197, 300; 257/E21.431, E21.437, 257/E21.632
See application file for complete search history.

(56) References Cited

U.S. PATENT DOCUMENTS

| 6,544,874 B2 | 4/2003 | Mandelman et al. |
| 6,621,131 B2 | 9/2003 | Murthy et al. |
| 6,642,125 B2 | 11/2003 | Oh et al. |
| 6,900,502 B2 | 5/2005 | Ge et al. |
| 7,112,495 B2 * | 9/2006 | Ko et al. ............... 438/300 |
| 7,176,481 B2 * | 2/2007 | Chen et al. ............ 257/19 |
| 7,282,415 B2 * | 10/2007 | Zhang et al. .......... 438/300 |
| 2004/0262694 A1 | 12/2004 | Chidambaram et al. |
| 2005/0035409 A1 | 2/2005 | Ko et al. |
| 2005/0090082 A1 | 4/2005 | Sridhar et al. |
| 2005/0139872 A1 | 6/2005 | Chidambaram et al. |
| 2006/0022266 A1 * | 2/2006 | Messenger et al. ...... 257/347 |
| 2006/0046367 A1 * | 3/2006 | Rotondaro et al. ...... 438/199 |
| 2006/0240636 A1 * | 10/2006 | Ryu et al. ............. 438/424 |
| 2007/0020839 A1 | 1/2007 | Sridhar et al. |
| 2007/0296038 A1 * | 12/2007 | Chen et al. ............ 257/350 |

* cited by examiner

*Primary Examiner*—Asok K Sarkar
(74) *Attorney, Agent, or Firm*—Rose Alyssa Keagy; Wade J. Brady, III; Frederick J. Telecky, Jr.

(57) ABSTRACT

A method 300 for forming a transistor's drain extension 70 and recessed strained epi regions 150 with a single mask step 306. In an example embodiment, the method 300 may include forming a patterned photoresist layer 200 over a protection layer 190 in a NMOS region 50 and then etching exposed portions of the protection layer 190 in the PMOS region 60 to form extension sidewalls 210 on the transistors 30 in the PMOS region 60 plus a protective hardmask 220 over the NMOS region 50. The method 300 may further include forming the extension regions 70 for the PMOS region transistors 30, performing a recess etch 240 of active regions 230 of the PMOS region transistors 30, and forming the recessed strained epi regions 150.

30 Claims, 8 Drawing Sheets

USE OF A SINGLE MASK DURING THE FORMATION OF A TRANSISTOR'S DRAIN EXTENSION AND RECESSED STRAINED EPI REGIONS

BACKGROUND OF THE INVENTION

This invention relates to a method of forming CMOS transistor drain extensions and recessed strained epi regions on semiconductor wafers.

DETAILED DESCRIPTION OF THE INVENTION

Figure 1:
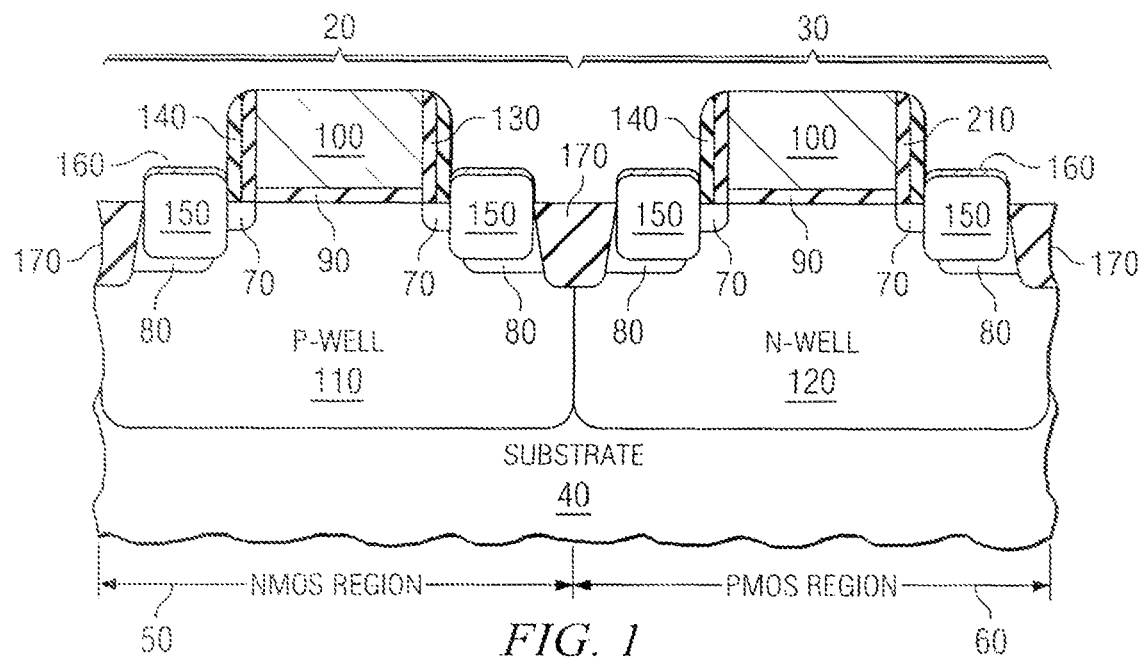
FIG. 1 is a cross-sectional view of a partially fabricated semiconductor wafer.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-sectional view of a partially fabricated semiconductor wafer 10. In the example application, CMOS transistors 20, 30 are formed within a semiconductor substrate 40 having an NMOS region 50 and a PMOS region 60. The CMOS transistors 20, 30 are electrically insulated from other active devices (not shown) by shallow trench isolation structures 170 formed within the NMOS and PMOS regions 50, 60; however, any conventional isolation structure may be used such as field oxide regions (also known as "LOCOS" regions) or implanted isolation regions. The semiconductor substrate 40 is a single-crystalline substrate that is doped to be n-type and p-type; however, it may be a different material such as GaAs and InP and it may have additional layers.

Transistors, such as CMOS transistors 20, 30, are generally comprised of a gate, source, and drain. More specifically, as shown in FIG. 1, the active portion of the transistors are comprised of extension regions 70, source and drain regions 80, and a gate that is comprised of a gate oxide 90 and a gate polysilicon electrode 100. The CMOS transistors 20, 30 also have a channel region that is located directly below the gate oxide 90 within the p-well 110 or the n-well 120.

The example NMOS transistor 20 is an n-channel MOS transistor. Therefore it is formed within a p-well region 110 of the semiconductor substrate 40. In addition, the source and drain regions 80 as well as the extension regions 70 (which may be lightly doped ("LDD"), medium doped ("MDD"), or highly doped ("HDD")) have n-type dopants. The NMOS transistor gate is created from an n-type doped polysilicon electrode 100 and a gate oxide dielectric 90. However, it is within the scope of the invention for the NMOS transistor to have a metal gate instead of a polysilicon gate. A metal gate electrode 100 is preferably a fully silicided ("FUSI") polysilicon electrode. However, the metal gate electrode 100 may be comprised of any commonly used metal such as Ti, Ta, Ir, Mo, or any combinations thereof—including their molecules and complexes, Similarly, the example PMOS transistor 30 is a p-channel MOS transistor. Therefore it is formed within an n-well region 120 of the semiconductor substrate 40. In addition, the source and drain regions 80 as well as the extension regions 70 have p-type dopants. The PMOS transistor gate is created from a p-type doped polysilicon electrode 100 and a gate oxide dielectric 90. However, it is within the scope of the invention for the PMOS transistor to have a metal gate electrode 100, as discussed supra.

A sidewall spacer structure comprising offset layers 130/210, 140 may be used during semiconductor fabrication to enable the proper placement of the extension regions 70 and the source/drain regions 80. The extension regions 70 are formed using the gate stack 90, 100 and the extension sidewalls 130/210 as a mask. Similarly, the source/drain regions 80 are formed using the gate stack 90, 100 and the source/drain sidewalls 140 as a mask.

In accordance with the invention, the gate stack 90, 100 and the extension sidewalls 130/210 of either the NMOS transistors 20 or the PMOS transistors 30 are also used as a mask to form the recessed strained epi regions 150. The recessed strained epi regions 150 may improve transistor performance by increasing the mobility of the carriers in the channel of the CMOS transistors 20, 30 through a lattice mismatch that induces mechanical stress or strain across the channel regions. Specifically, a tensile-strained channel typically provides the electron mobility enhancement that is beneficial for NMOS transistors 20. Alternatively, a compressive-strained channel typically provides the hole mobility enhancement that is beneficial for PMOS transistors 30. It is to be noted that the recessed strained epi regions 150 preferably have an optional silicide layer 160 that facilitates an improved electrical connection between the recessed strained epi regions 150 and the transistor's metal contacts (not shown).

Subsequent fabrication (not shown) will create the remainder of the "front end" portion and the "back-end" portion of the final integrated circuit. The remaining front-end portion generally contains metal contacts that electrically connect the CMOS transistors 20, 30 to other active or passive devices (not shown) that are located throughout the semiconductor wafer 10. The front-end also generally contains an insulative dielectric layer that electrically insulates the metal contacts. The back-end generally contains one or more interconnect layers (and possibly via layers) that properly route electrical signals and power though out the completed integrated circuit.

Referring again to the drawings, FIGS. 2A-2K are cross-sectional views of a partially fabricated semiconductor wafer that illustrate a process for forming a transistor's drain extension and recessed strained epi regions with a single mask step. In this example application the single mask step will be used to form the drain extension and recessed strained epi regions for the PMOS transistors 30 located in the PMOS region. FIG. 3 is the corresponding flow diagram illustrating the method 300 for forming a transistor's drain extension and recessed strained epi regions with a single mask step.

Those skilled in the art should appreciate that they can readily use the disclosed conception and embodiments as bases for forming the drain extension and recessed strained epi regions for the NMOS transistors 20 located in the NMOS region by simply using the opposite doping types. To avoid unnecessary detail, the information that is known to those of ordinary skill in the art to implement the disclosed method to form the drain extension and recessed strained epi regions for the NMOS transistors 20 located in the NMOS region is omitted herein. Additionally, it is appreciated that other transistor devices that employ one or more protective layers, but vary in some manner from the CMOS transistors 20, 30, are contemplated and are in accordance with the method of FIG. 3.

Figure 2A:
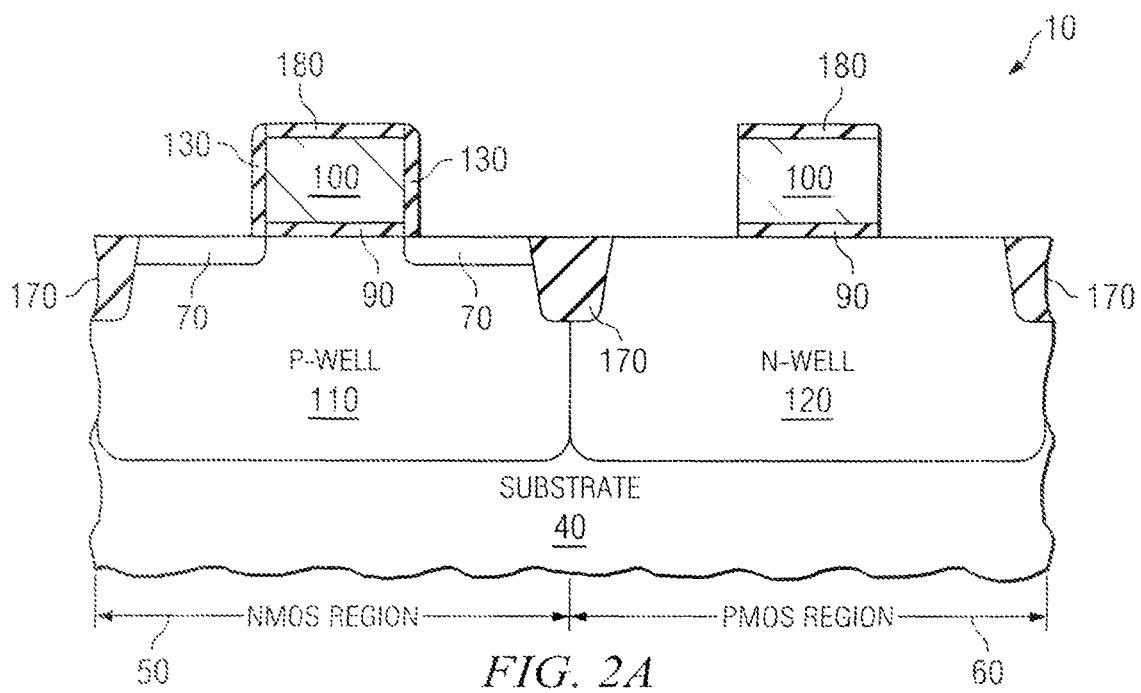
FIGS. 2A-2K are cross-sectional diagrams of a process for forming a semiconductor wafer.
Figure 3:
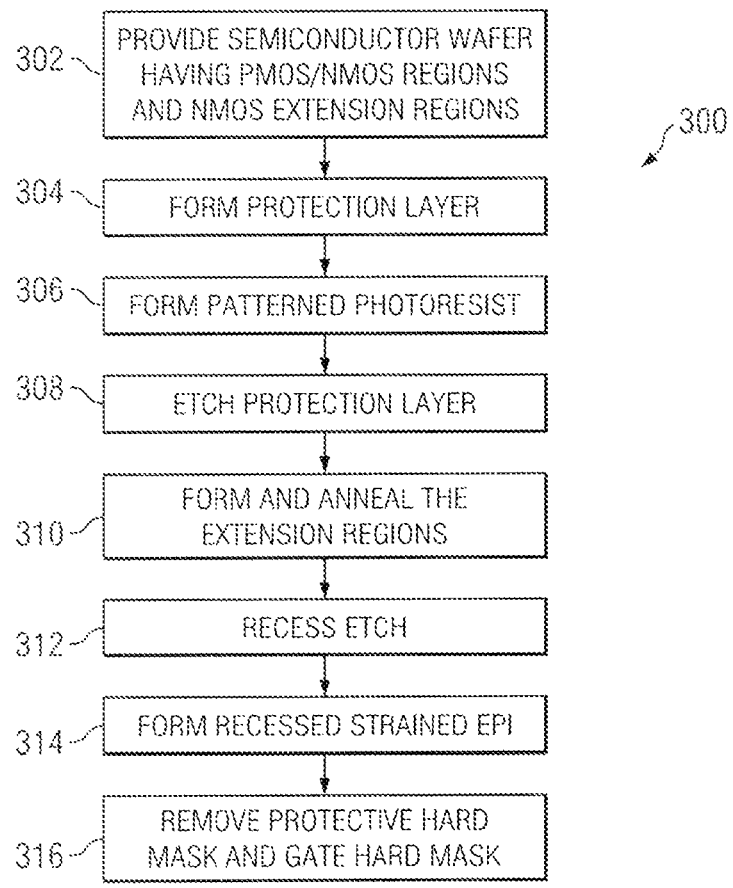
FIG. 3 is a method for forming a semiconductor wafer.

FIG. 2A is a cross-sectional view of the semiconductor wafer 10 after the formation of the p-wells 110, n-wells 120, shallow trench isolation structures 170, and the gate stack 90, 100 on the top surface of a semiconductor substrate 40 (step 302). The semiconductor wafer may also contain the extension sidewalls 130 and the extension regions 70 for all NMOS regions 50, as shown in FIG. 2A. The fabrication processes used to form the semiconductor wafer 10 shown in FIG. 2A are those that are standard in the industry, such as the fabrication process described in the commonly assigned U.S. Pat. No. 7,514,309 (Ser. No. 11/184,337, filed Jul. 19, 2005), incorporated herein by reference and not admitted to be prior art with respect to the present invention by its mention in this section. Preferably, all of the gate electrodes have a gate hardmask 180 comprised of $SiO_2$, SiN, SiON, or a combination thereof, as described in the incorporated reference. If used, the gate hardmask 180 may protect the gate electrodes 100 from undesired etching and epitaxial formation during steps 312 and 314 infra.

Figure 2B:
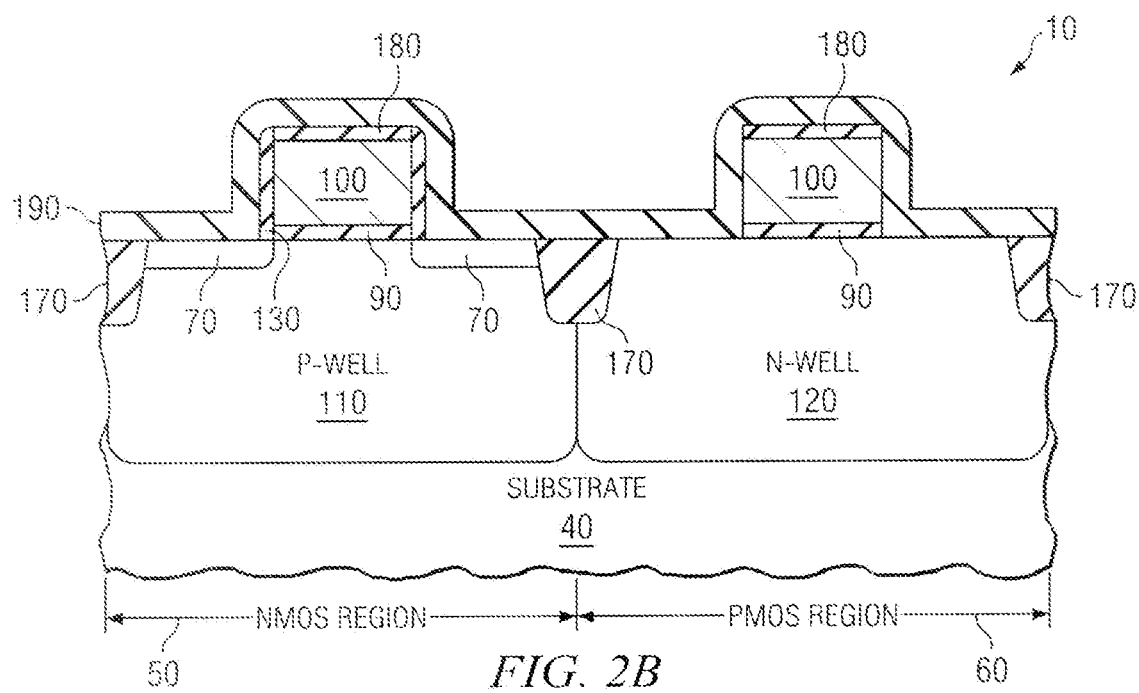

As shown in FIG. 2B, a protection layer 190 is formed over the semiconductor wafer 10 in step 304. The protection layer 190 is comprised of an insulative material, such as $SiO_2$, SiN, or a combination thereof. Preferably, the protective layer 190 is comprised of a first layer of oxide ($SiO_2$) and a layer of nitride (SiN). However, a second layer of oxide may be used over the nitride layer. As an example, the first oxide layer may be 15-100 Å thick, the layer of nitride may be 20-150 Å thick, and the optional second layer of oxide may be 10-100 Å thick. Any suitable Chemical Vapor Deposition ("CVD") or furnace-based machine may be used to form the protection layer 190.

Figure 2C:
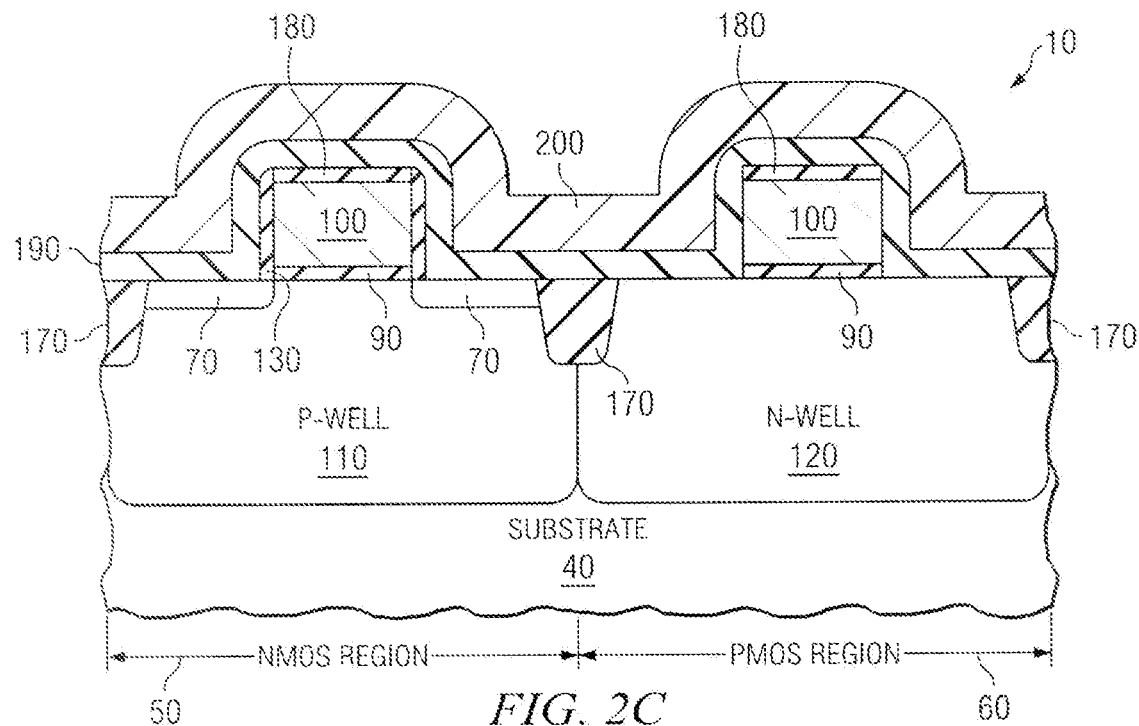

The next step, 306, is the formation of a patterned photoresist layer 200 that will protect the NMOS region 50 and open (therefore exposing) the PMOS region 60. As shown in FIG. 2C a layer of photoresist 200 is initially formed over the entire semiconductor wafer 10. Any suitable standard photoresist material and deposition machine may be used.

Figure 2D:
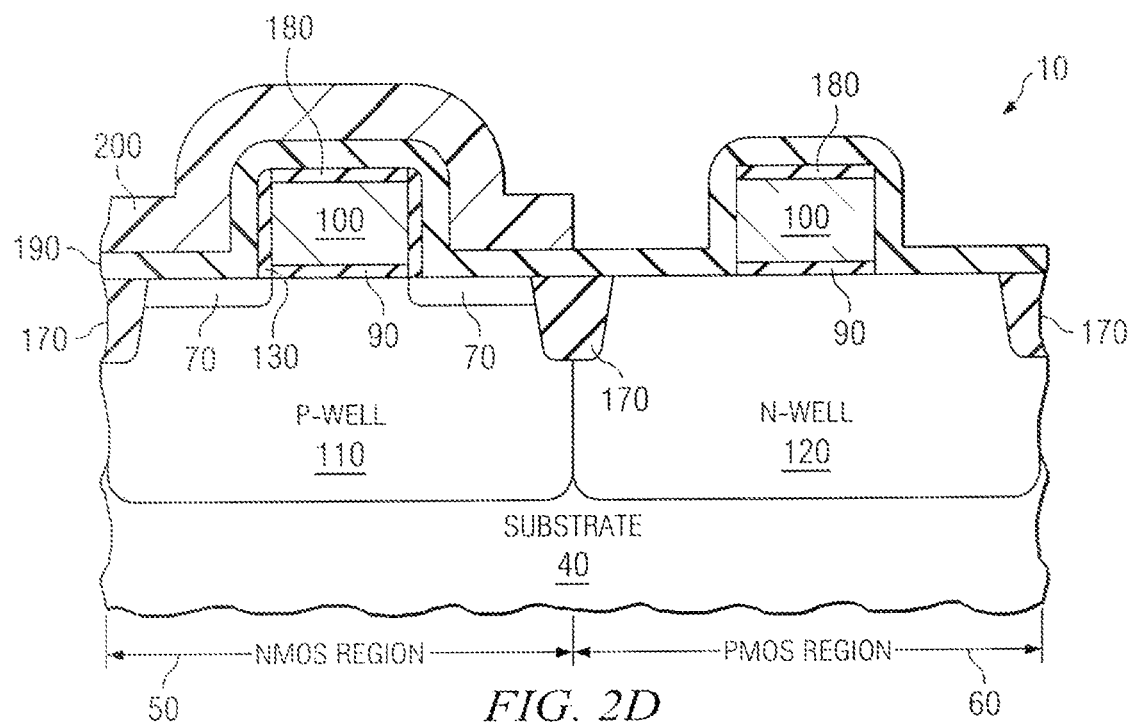
Figure 2E:
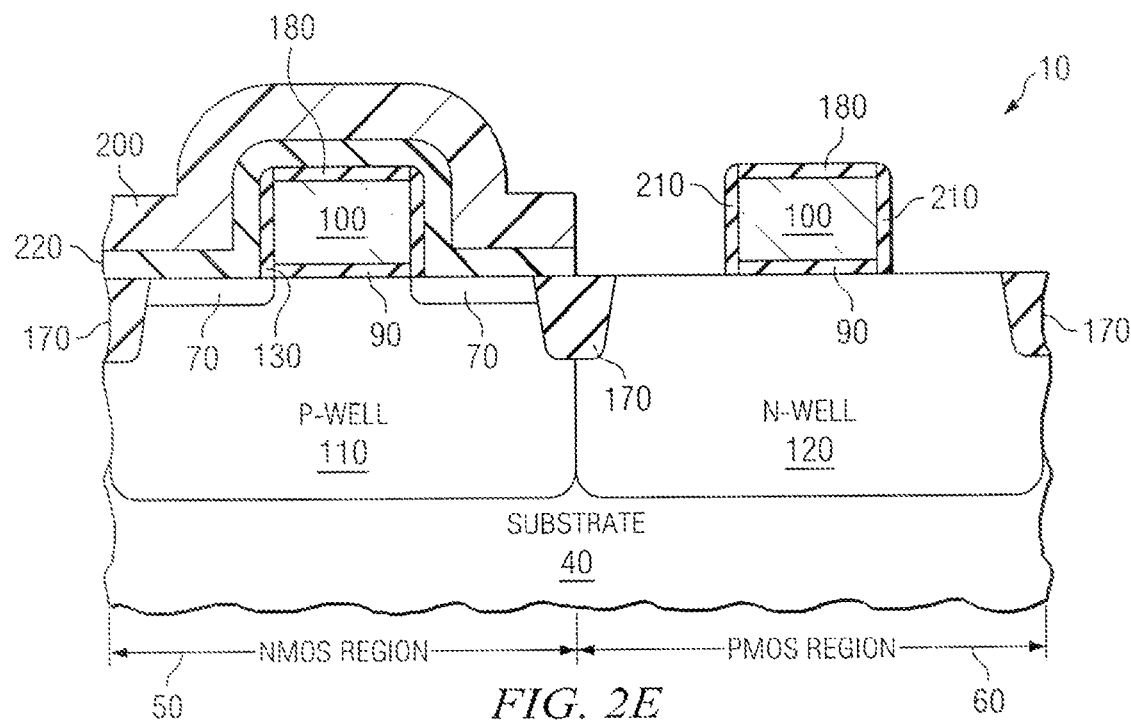

Then, as shown in FIG. 2D, a typical patterning process is used to remove the photoresist over the PMOS regions 60 but leave the photoresist over the NMOS regions 50. The exposed sections of the protective layer 190 are then etched (step 308) using a standard anisotropic etch process to form extension sidewalls 210 in the PMOS region 60, as shown in FIG. 2E. The photoresist mask 200 that is formed over the NMOS region (as also shown in FIG. 2E) preserves the protective layer, thereby creating a protective hardmask 220 over the NMOS region 50.

It is to be noted that the protection layer 190 may be comprised of a different material (with different material properties and etch rates) than the gate hardmask 180 in order to facilitate the etching of one without the removal of the other. For example, if the top layer of the gate hardmask 180 is comprised of $SiO_2$ than the protective layer 190 may have a SiN top layer. Alternatively, the same material may be used for both the protection layer 190 and the gate hardmask 180.

It is within the scope of the embodiment to remove the patterned photoresist mask 200 before the next step in the manufacturing process. However, in the example embodiment the patterned photoresist remains on the semiconductor wafer 10 through the formation of the extension regions, as described infra. If the patterned photoresist is removed at this point, any standard ash and clean process may be used for the photoresist removal.

Figure 2F:
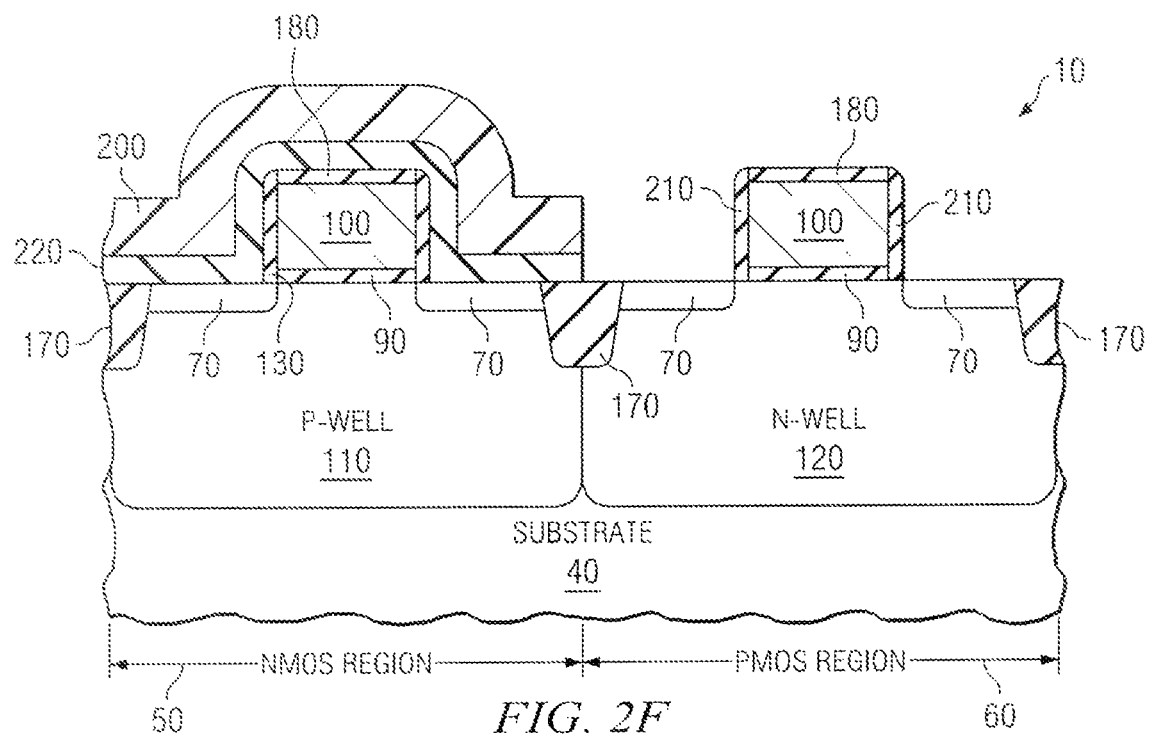

Next, the extension regions 70 are formed with any suitable standard manufacturing process in step 310. For example, extension sidewalls 210 are now used as a template to facilitate the proper placement of the extension regions 70, as shown in FIG. 2F. The extension regions 70 are formed near the top surface of the n-well 120 using any standard process, such as a low-energy ion implantation, gas phase diffusion, or solid phase diffusion. The dopants used to create the extension regions 70 for a PMOS transistor 30 are p-type (i.e. boron). If this process was switched—so that the protective hardmask 220 covered the PMOS region and the NMOS region was exposed—then the dopants used to create the extension regions 70 for an NMOS transistor 20 would by n-type (i.e. phosphorous or arsenic). However, other dopants or combinations of dopants may be used to form the extension regions 70. Because the extension sidewalls 210 are used to direct the dopant implantation to the proper location 70 within the n-well 120, the extension regions 70 initiate from points in the n-well 120 that are approximately at the outer corner of the extension sidewalls 210.

Figure 2G:
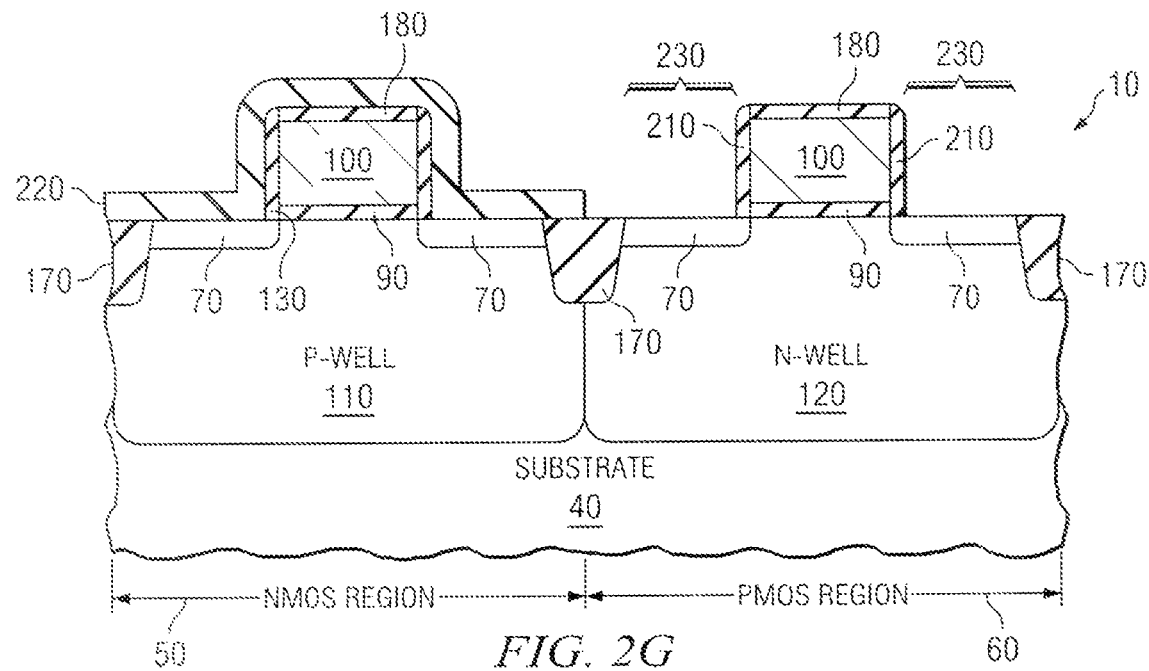

If the patterned photoresist 200 (located over the NMOS region 50) was not removed in an earlier step then it is now removed using any standard ash and clean process, as shown in FIG. 2G. In the example application, the extension regions 70 are activated by an anneal process after the implantation of the extension regions 70 and the removal of the photoresist. This anneal step may be performed with any suitable process such as rapid thermal anneal ("RTA"). The extension anneal will likely cause a lateral migration of each extension region toward the opposing extension region, as shown in FIG. 2G.

It is within the scope of the invention to also form halo implant regions within the n-well 120 (not shown). The halo implants (also called "pocket implants" or "punch through stoppers" for their ability to stop punch through current) may be formed with any standard implant or diffusion process within, or proximate to, the channel, extension regions, or source/drain regions.

Figure 2H:
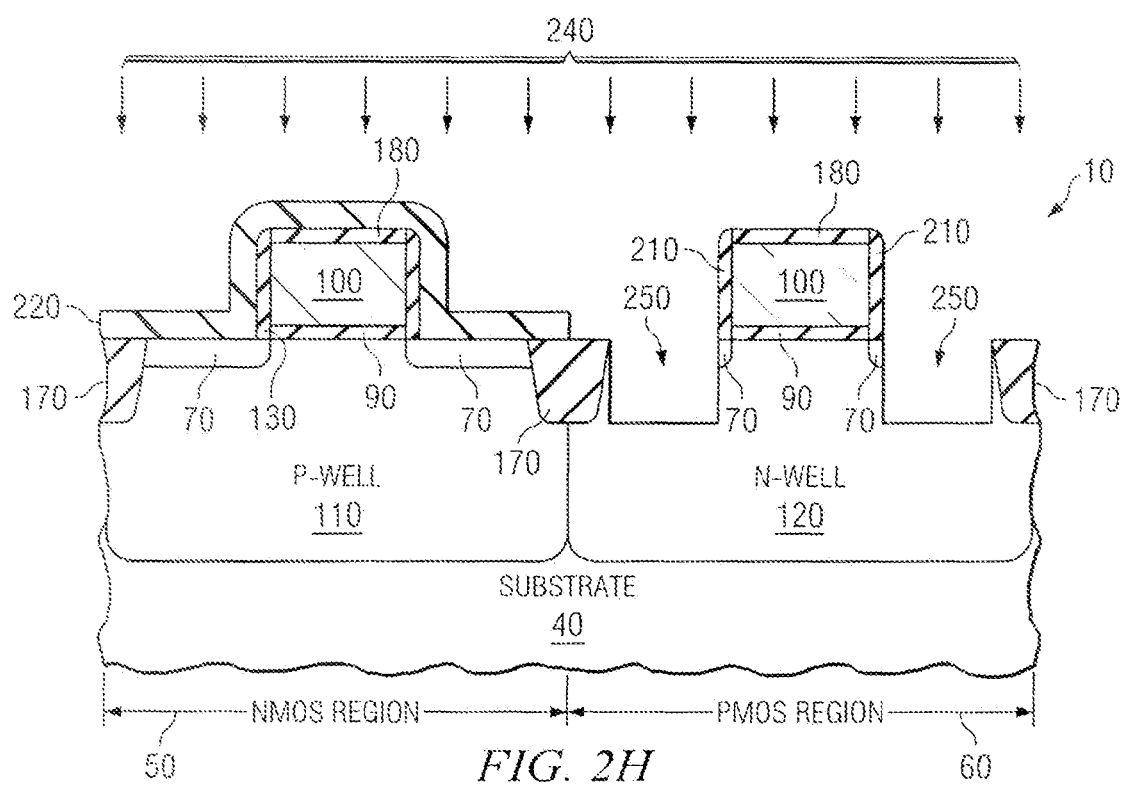

The next step, 312, is the recess etch of the active regions 230 of the PMOS region (i.e. the exposed silicon surfaces, as shown in FIG. 2G). In the example application, the recess etch 240 is a "box silicon etch", as shown in FIG. 2H. Preferably, the recess etch is a standard anisotropic etch of the active regions 230; therefore, the holes 250 formed by the recess etch won't cause an excessive removal of the doped extension regions 70.

Figure 2I:
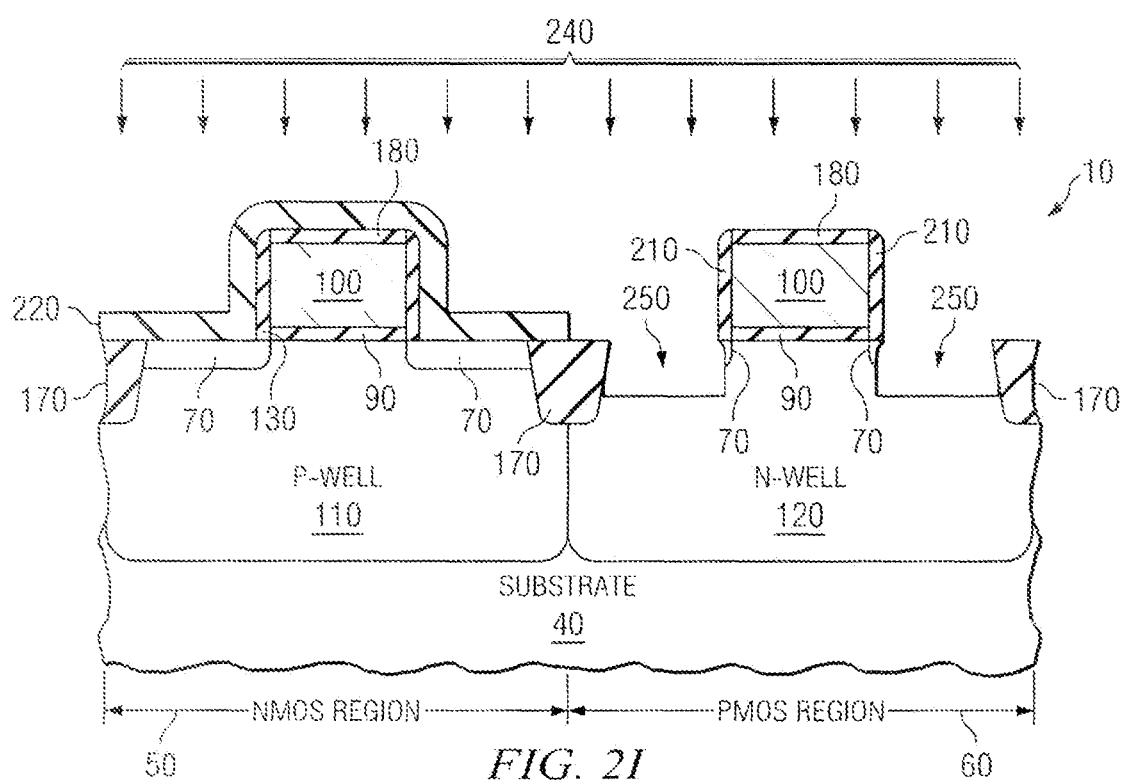

However, it is within the scope of the embodiment to perform the recess etch 240 using a combination of anisotropic and isotropic etches, or using an isotropic etch only, as shown in FIG. 2I. An isotropic etch will generally undercut the extension sidewalls 230, thereby creating a hole 250 that encroaches closer to the channel region and removes more material in the extension regions 70 (thus creating a corresponding change in the dosing level of those extension regions).

It is also within the scope of the invention to etch the holes 250 to any suitable depth. In the example application, the holes 250 are etched to a depth between 100-600 Å and they are approximately the same depth as the subsequently formed source and drain regions 80 (see FIG. 1).

The recess etch 240 is "selective" to the protective hardmask 220 as well as the gate hardmask 180. Therefore, the protective hardmask protects the NMOS region 50 from the recess etch 240 and the gate hardmask 180 protects the gate electrodes 100 in the PMOS region 60 from the recess etch 240. In addition, the protective hardmask 220 protects the NMOS region 50 and the gate hardmask 180 protects the gate electrodes 100 in the PMOS region 60 from the formation of strained epi 150 in the next fabrication step, 314. It is to be noted that a photoresist layer 200 could not be used in place of the protective hardmask 240 and the gate hardmask 180 in step 314 because photoresist cannot withstand the high temperatures that are used for the formation of the strained epi material. In addition, photoresist is comprised of organic material that would contaminate the machinery used in the epi process.

Figure 2J:
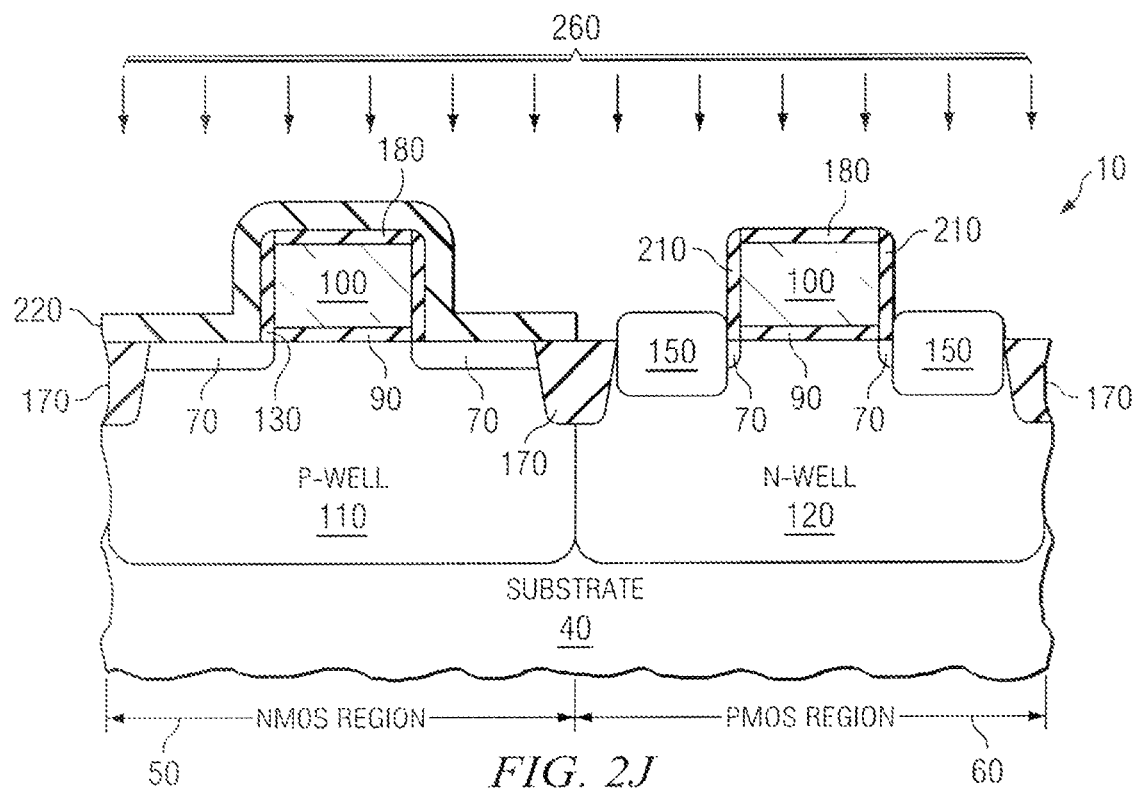

As shown in FIG. 2J, recessed strained epi regions 150 are now formed in the active regions of the PMOS 60. The recessed strained epi regions 150 are considered 'selective recessed strained epi' because the epitaxial layer 150 is selectively deposited on the active silicon substrate 40 but not on any amorphous regions, such as the regions containing $SiO_2$ or $Si_3N_4$. In the PMOS region 60, the recessed strained epi regions 150 are comprised of SiGe. However, if the recessed strained epi regions 150 are being formed in the NMOS region 50, they would be comprised of C substitutionally incorporated within Si.

In addition, the recessed strained epi regions 150 may be doped or undoped. In the example application, the recessed strained epi regions 150 are p-doped with B. If the recessed strained epi regions 150 are being formed in the NMOS region 50, they would be doped with P in the example application.

It is within the scope of the embodiment to use any suitable process 260 to form the recessed strained epi regions 150. For example, reduced-temperature chemical vapor deposition ("RTCVD"), ultra-high vacuum chemical vapor deposition ("UHCVD"), molecular beam epitaxy ("MBE"), or a small or large batch furnace-based process may be used.

In the example application, a RTCVD process 260 is used to from the recessed strained epi regions 150 shown in FIG. 2J (step 314). The example RTCVD process uses a temperature range of 450-800° C. and a pressure between 1-100 T. In addition, the RTCVD uses the silicon-bearing precursor DCS (dichlorosilane), the germanium-bearing precursor $GeH_4$ (germane), and the p-doping precursor $B_2H_6$ (diborane). Process selectivity is achieved by including HCl (hydrochloric acid) and the carrier gas $H_2$ (hydrogen). As shown in FIG. 2J, the epi process 260 will result in a slight rise in the top surface of the recessed strained epi regions 150 above the top surface of the prior active regions 230. The epi process (step 314) not only back-fills the hole 250, it also continues to grow to a height somewhere above the surface of the substrate 40. Forming the recessed strained epi regions 150 thicker than the holes 250 (i.e. the recessed regions) can mitigate damage to the recessed strained epi regions 150 during subsequent removal processes.

When the example application is used to form selective recessed strained epi in the NMOS regions 50, the example RTCVD process 260 uses a temperature range of 450-750° C. and a pressure between 1-100 T. In addition, the RTCVD uses the silicon-bearing precursor $Si_3H_8$ (trisilane), the carbon-bearing precursor $SiCH_6$ (methyl-silane), and the n-doping precursor $PH_3$ (phosphine). Process selectivity is achieved by including HCl (hydrochloric acid) and the carrier gas $H_2$ (hydrogen).

Figure 2K:
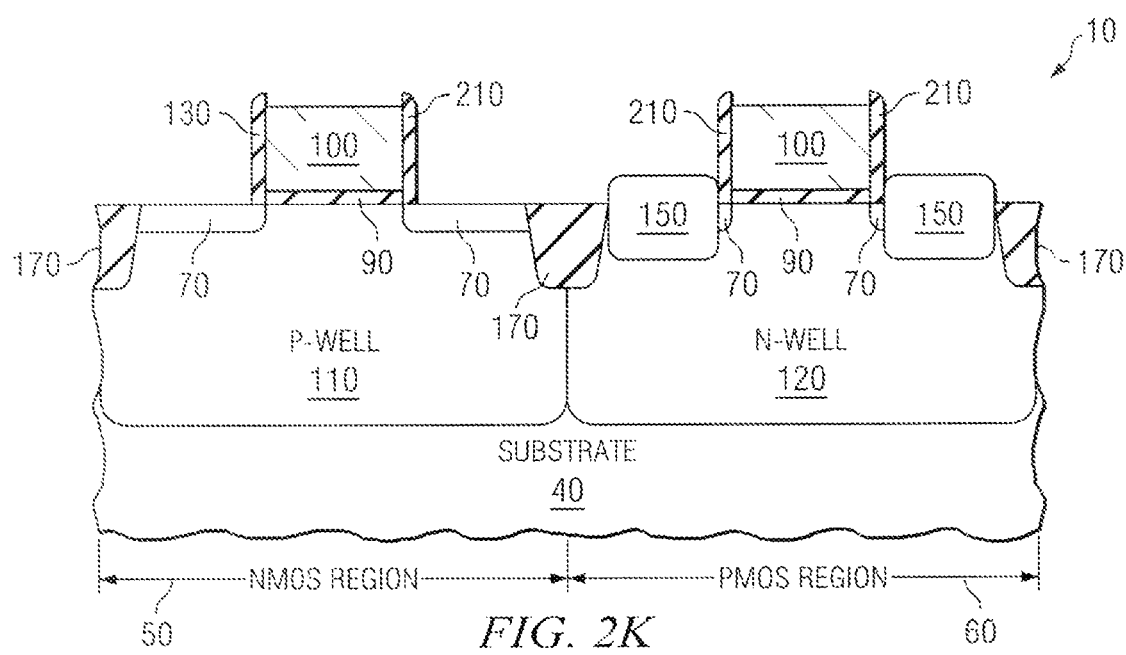

The protective hardmask 220 and the gate hardmask 180 are now removed, as shown in FIG. 2K. In step 316 any standard process may be used to strip the protective hardmask 220 and the gate hardmask 180. For example, if the protective hardmask 220 is comprised of a layer of nitride over a layer of oxide, then the top nitride layer may be removed by a wet etch such as a phosphoric acid strip. Then the bottom oxide layer may be removed by a HF wet etch. Once the protective hardmask 220 is removed, the gate hardmask 180 located over the gate electrodes in the NMOS and PMOS regions 50, 60 may be removed with any standard process. For example, if the gate hardmask 180 is SiN then it may be removed with a hot phosphoric acid strip.

The fabrication of the final integrated circuit continues with standard manufacturing steps in order to complete the PMOS and NMOS transistors 20, 30 shown in FIG. 1. Generally, the next steps are the formation of source/drain sidewalls 140, the creation of the source/drain regions 80, and then the formation of the optional silicide layer 160. The fabrication of the final integrated circuit continues further with the completion of the front-end and the fabrication of the back-end structure (as discussed supra). Once the fabrication process is complete, the integrated circuit will be tested and packaged.

Various additional modifications to the invention as described above are within the scope of the claimed invention. As an example, the method may be used during the fabrication of NMOS and PMOS composite transistors. In addition, the flow of the source gases during the epi process may be controlled to alter the composition of the strain or stress producing material. Furthermore, source/drain dopants may be implanted before, after, or during the formation of the recessed strained epi regions 150.

Figure 4A:
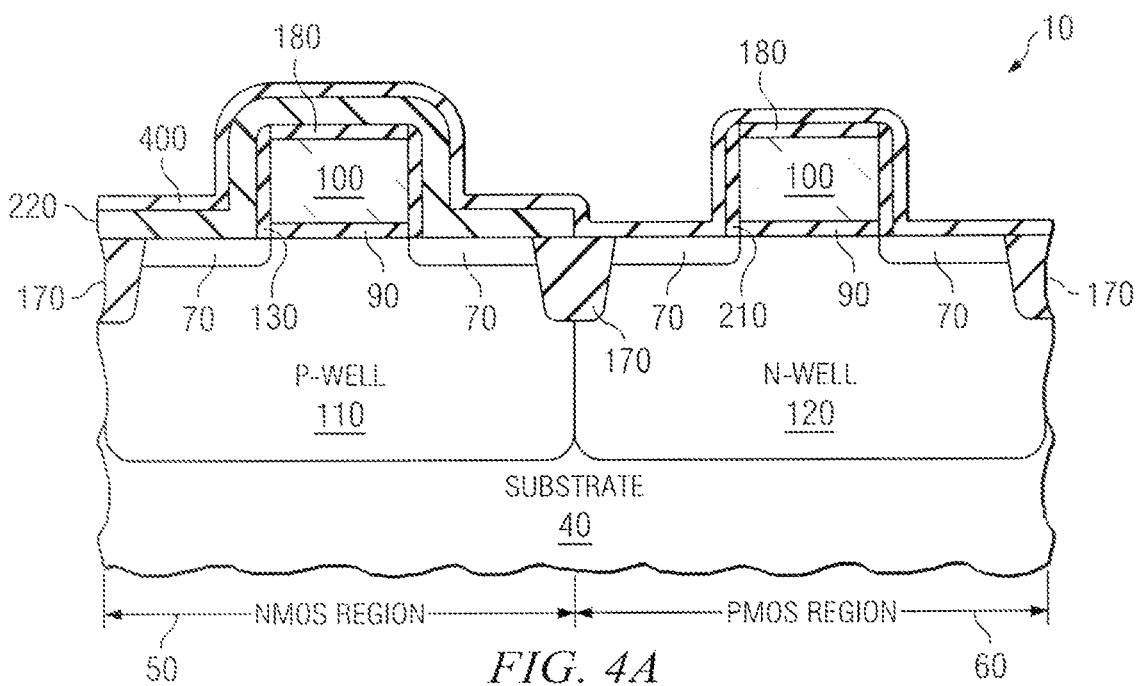
FIGS. 4A-4C are cross-sectional diagrams of an alternative process for forming a semiconductor wafer.
Figure 4B:
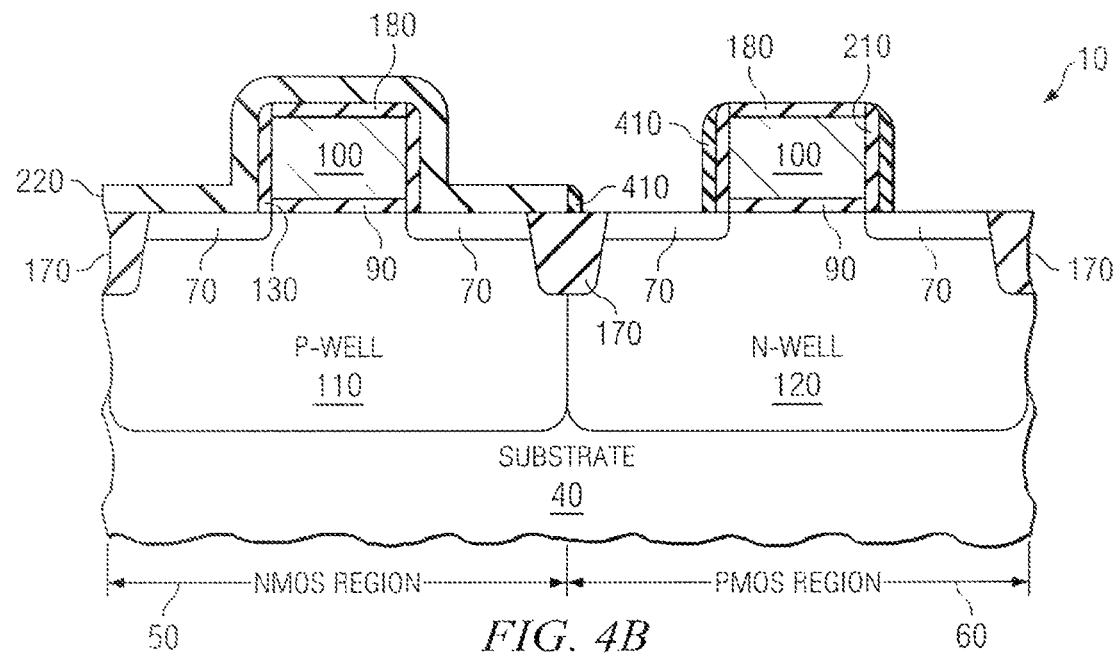
Figure 4C:
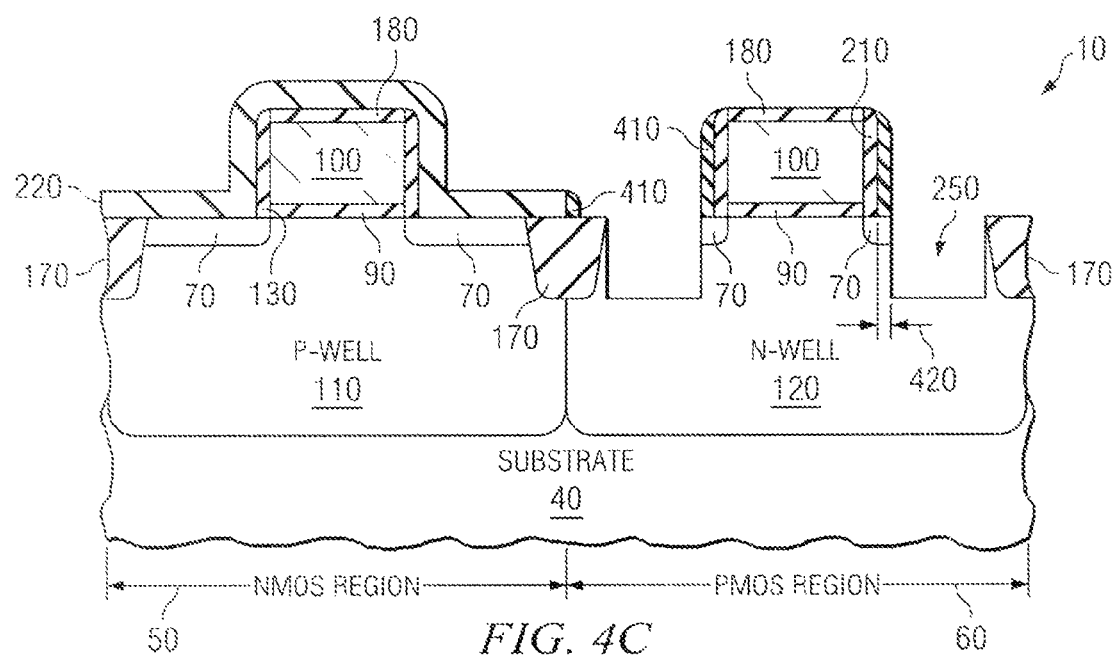

In an alternative application, the inside edge of the recess strained epi regions 150 may be moved further away from the channel region (possibly to retain more of the doped material of the extension regions 70 in order to obtain a targeted transistor performance parameter). In this alternative application, an additional offset layer 400 is first formed over the semiconductor wafer 10 after step 310, shown in FIG. 4A. The offset layer 400 may be comprised of a layer of oxide, a layer of nitride, or a combination thereof. In the example alternative application, a thin layer of oxide 400 (i.e. 20-100 Å thick) is formed over the semiconductor wafer 10 using any standard manufacturing process. Then, as shown in FIG. 4B, a standard anisotropic etch is performed on the semiconductor wafer 10, thereby forming offset sidewalls 410 proximate to the extension sidewalls 210 (and to the edge of the protective hardmask 220 over the STI region 170). During the subsequent recess etch step 312, the offset sidewalls 410 will cause the lateral displacement of the hole 250 by a distance that is approximately the thickness 420 of the sidewall at the N-well surface, as shown in FIG. 4C. The subsequently formed recessed strained epi regions 150 will be located further away from the transistor channel than the recessed strained epi regions 150 of FIG. 2J.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for forming extension regions and recessed strained epi regions of CMOS transistors in a semiconductor wafer, comprising:
   providing said semiconductor wafer having a PMOS region and an NMOS region, wherein said transistors in said NMOS region have NMOS extension regions;
   forming a protection layer over said semiconductor wafer;
   forming a patterned photoresist layer over said protection layer in said NMOS region;
   etching exposed portions of said protection layer in said PMOS region to form extension sidewalls on said transistors in said PMOS region and a protective hardmask over said NMOS region;
   forming PMOS extension regions for said PMOS region transistors, including an anneal of said PMOS extension regions;
   performing a recess etch of active regions of said PMOS region transistors after said anneal of said PMOS extension regions, wherein said protective hardmask protects said NMOS region from said recess etch and said PMOS extension region formation; and
   forming said recessed strained epi regions for said PMOS region transistors, wherein said protective hardmask protects said NMOS region from said formation of said recess strained epi.

2. The method of claim 1 further comprising the step of forming an oxide layer proximate said extension sidewalls prior to said step of performing said recess etch.

3. The method of claim 1 further comprising the step of forming an oxide layer and a nitride layer proximate said extension sidewalls prior to said step of performing said recess etch.

4. The method of claim 1 wherein said recessed strained epi is selective recessed strained epi.

5. The method of claim 1 wherein said recessed strained epi is comprised of SiGe.

6. The method of claim 1 wherein said recessed strained epi is comprised of SiGe doped with B.

7. The method of claim 1 wherein said patterned photoresist layer is removed prior to said anneal of said extension regions.

8. The method of claim 1 wherein at least one of said transistors has a polysilicon gate electrode.

9. The method of claim 1 wherein at least one of said transistors has a metal gate electrode.

10. The method of claim 1 wherein said protection layer comprises oxide.

11. The method of claim 1 wherein said protection layer comprises a layer of oxide and a layer of nitride.

12. The method of claim 1 wherein said protection layer comprises a first layer of oxide, a layer of nitride, and a second layer of oxide.

13. The method of claim 1 wherein all of said transistors have a gate hardmask.

14. The method of claim 1 wherein said recess etch is performed to a depth greater than the depth of said extension regions.

15. The method of claim 1 wherein said recessed strained epi is formed using a RTCVD process.

16. A method for forming extension regions and recessed strained epi regions of CMOS transistors in a semiconductor wafer, comprising:
   providing said semiconductor wafer having a PMOS region and an NMOS region, wherein said transistors in said PMOS region have PMOS extension regions;
   forming a protection layer over said semiconductor wafer;
   forming a patterned photoresist layer over said protection layer in said PMOS region;
   etching exposed portions of said protection layer in said NMOS region to form extension sidewalls on said transistors in said NMOS region and a protective hardmask over said PMOS region;
   forming NMOS extension regions for said NMOS region transistors, including an anneal of said NMOS extension regions;
   performing a recess etch of active regions of said NMOS region transistors after said anneal of said NMOS extension regions, wherein said protective hardmask protects said PMOS region from said recess etch and said NMOS extension region formation; and
   forming said recessed strained epi regions for said NMOS region transistors, wherein said protective hardmask protects said PMOS region from said formation of said recess strained epi.

17. The method of claim 16 further comprising the step of forming an oxide layer proximate said extension sidewalls prior to said step of performing said recess etch.

18. The method of claim 16 further comprising the step of forming an oxide layer and a nitride layer proximate said extension sidewalls prior to said step of performing said recess etch.

19. The method of claim 16 wherein said recessed strained epi is selective recessed strained epi.

20. The method of claim 16 wherein said recessed strained epi is comprised of SiC.

21. The method of claim 16 wherein said recessed strained epi is comprised of SiC doped with P.

22. The method of claim 16 wherein said patterned photoresist layer is removed prior to said anneal of said extension regions.

23. The method of claim 16 wherein at least one of said transistors has a polysilicon gate electrode.

24. The method of claim 16 wherein at least one of said transistors has a metal gate electrode.

25. The method of claim 16 wherein said protection layer comprises oxide.

26. The method of claim 16 wherein said protection layer comprises a layer of oxide and a layer of nitride.

27. The method of claim 16 wherein said protection layer comprises a first layer of oxide, a layer of nitride, and a second layer of oxide.

28. The method of claim 16 wherein all of said transistors have a gate hardmask.

29. The method of claim 16 wherein said recess etch is performed to a depth greater than the depth of said extension regions.

30. The method of claim 16 wherein said recessed strained epi is formed using a RTCVD process.

* * * * *